(12) United States Patent
Chen et al.

(10) Patent No.: US 10,879,224 B2
(45) Date of Patent: Dec. 29, 2020

(54) PACKAGE STRUCTURE, DIE AND METHOD OF MANUFACTURING THE SAME

(71) Applicant: Taiwan Semiconductor Manufacturing Co., Ltd., Hsinchu (TW)

(72) Inventors: Wei-Yu Chen, New Taipei (TW); An-Jhih Su, Taoyuan (TW); Der-Chyang Yeh, Hsin-Chu (TW); Hua-Wei Tseng, New Taipei (TW); Li-Hsien Huang, Hsinchu County (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/260,127

(22) Filed: Jan. 29, 2019

(65) Prior Publication Data

US 2020/0135708 A1    Apr. 30, 2020

Related U.S. Application Data

(60) Provisional application No. 62/752,369, filed on Oct. 30, 2018.

(51) Int. Cl.
*H01L 25/18* (2006.01)
*H01L 23/522* (2006.01)
(Continued)

(52) U.S. Cl.
CPC ............ *H01L 25/18* (2013.01); *H01L 21/563* (2013.01); *H01L 21/565* (2013.01);
(Continued)

(58) Field of Classification Search
CPC ..... H01L 25/18; H01L 21/563; H01L 21/565; H01L 21/76871; H01L 23/3121;
(Continued)

(56) References Cited

U.S. PATENT DOCUMENTS 9,000,584 B2    4/2015    Lin et al.
9,048,222 B2    6/2015    Hung et al.
(Continued)

FOREIGN PATENT DOCUMENTS

TW    201539687    10/2015
TW    201820464    6/2018
(Continued)

OTHER PUBLICATIONS

"Office Action of Taiwan Counterpart Application," dated Dec. 23, 2019, p. 1-p. 8.
(Continued)

*Primary Examiner* — Tu-Tu V Ho
(74) *Attorney, Agent, or Firm* — JCIPRNET

(57) ABSTRACT

A package structure, a die and method of forming the same are provided. The package structure includes a die, an encapsulant, a RDL structure, and a conductive terminal. The die has a connector. The connector includes a seed layer and a conductive on the seed layer. The seed layer extends beyond a sidewall of the conductive pillar. The encapsulant is aside the die and encapsulates sidewalls of the die. The RDL structure is electrically connected to the die. The conductive terminal is electrically connected to the die through the RDL structure.

20 Claims, 13 Drawing Sheets

(51) Int. Cl.
  *H01L 23/538* (2006.01)
  *H01L 21/768* (2006.01)
  *H01L 21/56* (2006.01)
  *H01L 23/00* (2006.01)
  *H01L 23/31* (2006.01)

(52) U.S. Cl.
  CPC .... *H01L 21/76871* (2013.01); *H01L 23/3121* (2013.01); *H01L 23/5226* (2013.01); *H01L 23/5384* (2013.01); *H01L 23/5386* (2013.01); *H01L 24/09* (2013.01); *H01L 24/17* (2013.01); *H01L 24/33* (2013.01); *H01L 24/73* (2013.01); *H01L 2224/0231* (2013.01); *H01L 2224/02373* (2013.01); *H01L 2224/02379* (2013.01); *H01L 2224/73253* (2013.01)

(58) Field of Classification Search
  CPC ............ H01L 23/5226; H01L 23/5384; H01L 23/5386; H01L 24/09; H01L 24/17; H01L 24/33; H01L 24/73; H01L 2224/0231; H01L 2224/02373; H01L 2224/02379; H01L 2224/73253
  USPC ........................................................ 257/690
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2013/0168848 A1* | 7/2013 | Lin .................. H01L 21/78 257/737 |
| 2016/0155684 A1* | 6/2016 | Lin .................. H01L 24/02 257/712 |

FOREIGN PATENT DOCUMENTS

| | | |
|---|---|---|
| TW | 201824488 | 7/2018 |
| TW | 201834154 | 9/2018 |

OTHER PUBLICATIONS

"Office Action of Taiwan Counterpart Application", dated Sep. 14, 2020, p. 1-p. 8.

* cited by examiner

PACKAGE STRUCTURE, DIE AND METHOD OF MANUFACTURING THE SAME

CROSS-REFERENCE TO RELATED APPLICATION

This application claims the priority benefit of U.S. provisional application Ser. No. 62/752,369, filed on Oct. 30, 2018. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness.

DETAILED DESCRIPTION

Figure 1A:
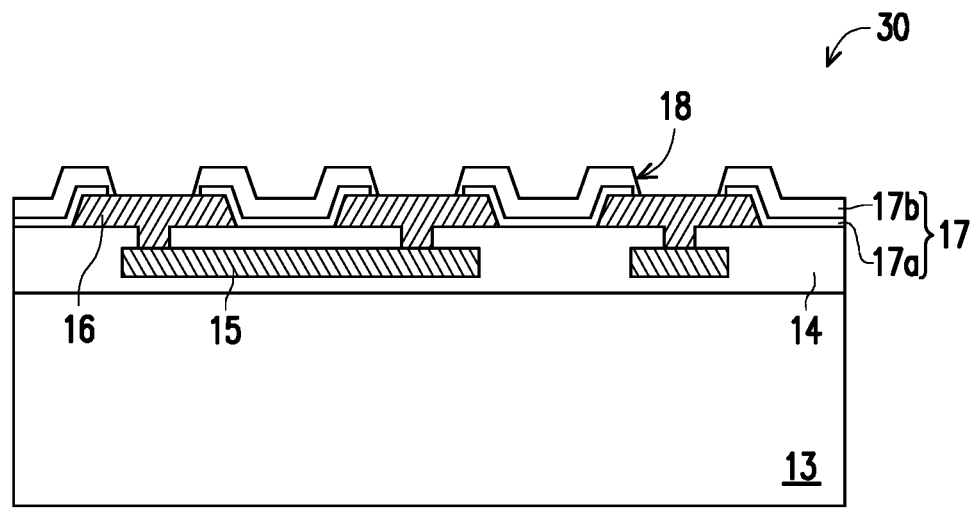
FIG. 1A to FIG. 1J are schematic cross-sectional views illustrating a method of forming a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a method of forming a package structure according to some embodiments of the disclosure, wherein FIG. 1A to FIG. 1F illustrate a method of forming a die according to some embodiments of the disclosure.

Referring to FIG. 1A, a wafer including a plurality of dies 30 is provided. For the sake of brevity, one die 30 is shown. In some embodiments, the dies 30 are arranged in an array in the wafer before a die-saw process is performed, but the disclosure is not limited thereto. In some other embodiments, the die 30 is provided after the die saw process is performed. That is, the die 30 may have been cut from a wafer.

In some embodiments, the die 30 includes a substrate 13, a dielectric structure 14, an interconnection structure 15, a pad 16 and a passivation layer 17. In some embodiments, the substrate 13 is made of silicon or other semiconductor materials. Alternatively or additionally, the substrate 13 includes other elementary semiconductor materials such as germanium, gallium arsenic, or other suitable semiconductor materials. In some embodiments, the substrate 13 may further include other features such as various doped regions, a buried layer, and/or an epitaxy layer. Moreover, in some embodiments, the substrate 13 is made of an alloy semiconductor such as silicon germanium, silicon germanium carbide, gallium arsenic phosphide, or gallium indium phosphide. Furthermore, the substrate 13 may be a semiconductor on insulator such as silicon on insulator (SOI) or silicon on sapphire.

In some embodiments, devices (not shown) are formed in or on the substrate 13. In some embodiments, the devices may be active devices, passive devices, or a combination thereof. In some embodiments, the devices are integrated circuit devices. The devices are, for example, transistors, capacitors, resistors, diodes, photodiodes, fuse devices, or the like.

Interconnection structure 15 and the dielectric structure 14 are formed over the devices on the substrate 13. Interconnection structure 15 is formed in the dielectric structure 14 and connected to different devices to form a functional circuit. In some embodiments, the dielectric structure 14 includes an inter-layer dielectric layer (ILD) and one or more inter-metal dielectric layers (IMD). In some embodiments, the interconnection structure 15 includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 16 are formed on the interconnect structure 15. The pads 16 are electrically connected to the interconnect structure 15, so as to provide an external connection of the die 30. In some embodiments, the pad 16 is a top conductive feature of the interconnect structure 15. The material of the pads 16 may include metal or metal alloy, such as aluminum, copper, nickel, or alloys thereof.

The passivation layer 17 is formed over the substrate 13 and covers a portion of the pads 16. A portion of the pads 16 is exposed by the passivation layer 17 and serves as an external connection of the die 30. The passivation layer 17 includes an insulating material such as silicon oxide, silicon nitride, polymer, or a combination thereof. The polymer is, for instance, polybenzoxazole (PBO), polyimide (PI), benzocyclobutene (BCB), a combination thereof, or the like. The passivation layer 17 has an opening 18 exposing a portion of the pads 16. The passivation layer 17 may be a single-layer structure or a multi-layer structure.

In some embodiments, the passivation layer 17 is a bi-layer structure and includes a first passivation sublayer 17a and a second passivation sublayer 17b on the first passivation sublayer 17a. The material of the first passivation layer 17a and the material of the second passivation sublayer 17b may be the same or different. In some embodiments, the second passivation sublayer 17b is also referred to as a post-passivation layer, and is optionally formed. In some embodiments, the first passivation sublayer 17a may be a silicon oxide layer, a silicon nitride layer, a silicon oxy-nitride layer or a dielectric layer formed by other suitable dielectric materials. The second passivation sublayer 17b may be a polymer layer such as including PBO, PI, BCB, combinations thereof or the like. However, the disclosure is not limited thereto.

The first and second passivation sublayers 17a and 17b may be formed by the following processes: a first passivation material layer is formed over the substrate 13 to cover the pads 16 through spin coating, chemical vapor deposition (CVD) or other suitable techniques; thereafter, the first passivation material layer is patterned by photolithography and etching processes, such that openings are formed in the first passivation material layer to expose portions of the pads 16. A second passivation material layer such as a polymer layer is then formed on the first passivation sublayer 17a and the pads 16 by spin coating, for example. Afterwards, a curing process is performed to cure the polymer layer. A laser drilling process is then performed to pattern the second passivation material layer, such that the openings 18 are formed to expose the pads 16. In some embodiments in which the second passivation sublayer 17b is a PI layer, the temperature of the curing process is between 300° C. to 400° C., such as 390° C., and the PI layer may also referred to as a high temperature PI layer.

Figure 1B:
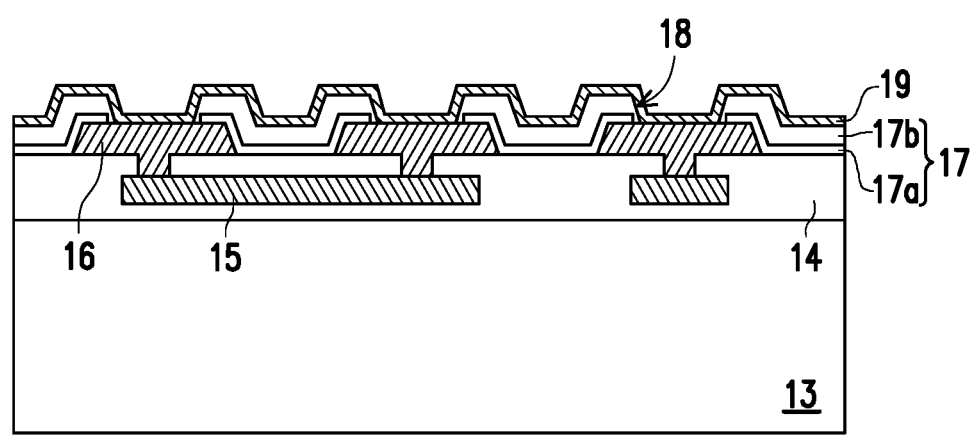

Referring to FIG. 1B, a seed layer 19 is formed over the substrate 13 by a physical vapor deposition (PVD) process such as a sputtering process. In some embodiments, the seed layer 19 may be a copper seed layer or other suitable metal layer. The material of the seed layer 19 may include, titanium (Ti), titanium tungsten (TiW), Tantalum (Ta), copper (Cu), combinations thereof or the like. The seed layer 19 may be a single layer structure or a multi-layer structure. In some embodiments, the seed layer 19 includes a first seed layer such as a titanium layer and a second seed layer such as a copper layer on the first seed layer.

In some embodiments, the seed layer 19 conformally covers the pads 16 and the passivation layer 17. That is, the seed layer 19 has a substantially equal thickness extending along the region on which the seed layer 19 is formed. The seed layer 19 is in electrical contact with the pads 16 and further electrically connected to the interconnection structure 15 through the pads 16. The seed layer 19 covers the top surfaces of the passivation layer 17 and fills into the openings 18 to cover sidewalls of the passivation layer 17 and the top surfaces of the pads 16 exposed by the openings 18.

Figure 1C:
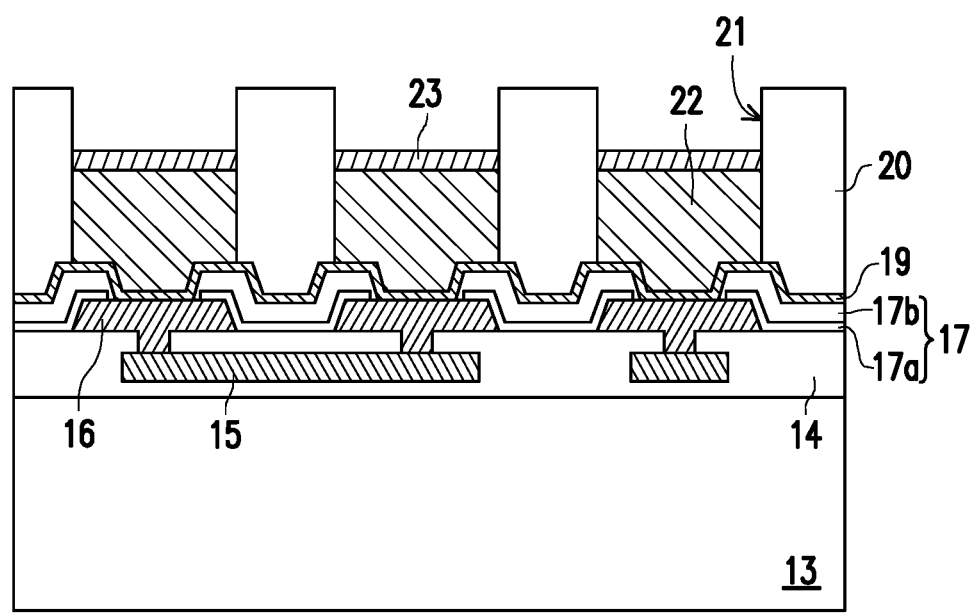

Referring to FIG. 1C, a patterned mask layer 20 having openings 21 is formed over the substrate 13. The patterned mask layer 20 may be a patterned photoresist, for example. In some embodiments, the openings 21 are formed directly over the openings 18 (FIG. 1B) of the passivation layer 17, exposing the seed layer 19 covering surfaces of the openings 18 and a portion of the seed layer 19 on the top surface of the passivation layer 17. Thereafter, conductive pillars 22 and test pads 23 are formed on the seed layer 19 exposed by the openings 21 of the patterned mask layer 20. The conductive pillars 22 may include copper, nickel, combinations thereof, or other suitable metal, and may be formed by plating process, such as electroplating, electroless plating or the like. The conductive pillars 22 are electrically connected to the pads 16 through the seed layer 19.

In some embodiments, test pads 23 are formed on the conductive pillars 22 for verification testing such as electrical testing in the subsequent process. The test pad 23 includes conductive materials. In some embodiments, the test pad 23 is a solder layer including tin or tin alloy. The test pad 23 may be formed by plating process, such as electroplating, electroless plating or the like. The cross-sectional shape of the conductive pillar 22 may be square, rectangular, rounded or the like, or other suitable shape. The top surface of the conductive pillar 22 may be flat, rounded, arced, or the like, and the disclosure is not limited thereto. The cross-sectional shape of the test pad 23 may be square, rectanglular, arced, rounded or the like, and the top surface of the test pad 23 may be flat, rounded, arced, or the like, and the disclosure is not limited thereto. In some embodiments, the sidewalls of the test pad 23 are aligned with the sidewalls of the conductive pillar 22.

Figure 1D:
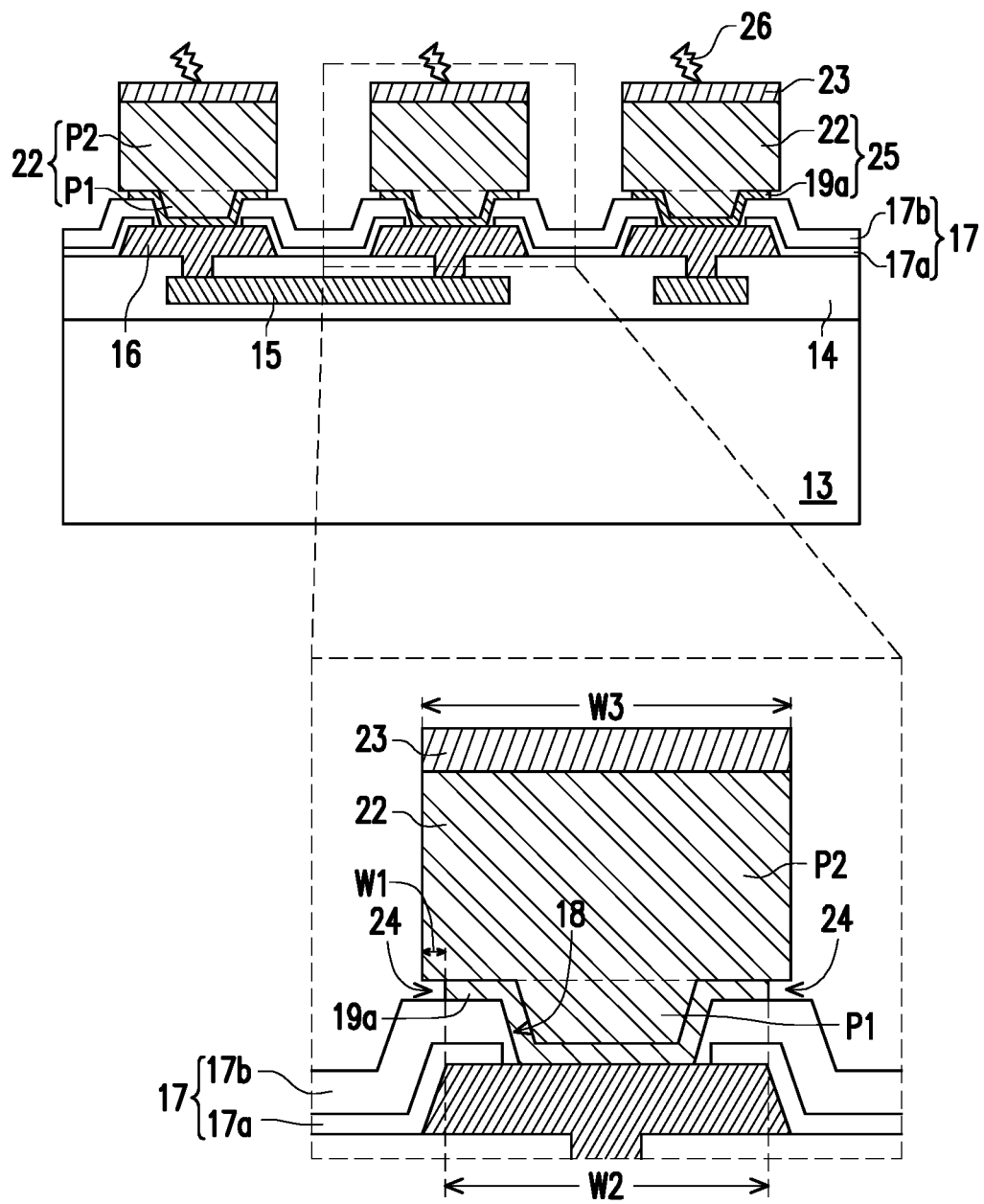

Referring to FIG. 1C and FIG. 1D, the patterned mask layer 20 is stripped by an ashing process, an etching process such as wet etching or dry etching, for example. An etching process with the conductive pillars 22 and the test pads 23 as a mask is performed, so as to remove the seed layer 19 not covered by the conductive pillar 22, and a seed layer 19a underlying the conductive pillar 22 is formed. The seed layer 19a and the conductive pillar 22 form a connector 25. The etching process may include dry etching, wet etching or a combination thereof. In some embodiments, the etching process is performed with a high etching selectivity ratio of the seed layer 19 to the conductive pillar 22, and the conductive pillar 22 is substantially not etched during the etching process.

Referring to the enlarged view of the connector 25. In some embodiments, during the etching process of the seed layer 19, a portion of the seed layer 19 underlying the conductive pillar 22 and adjacent to the edge of the sidewall of the conductive pillar 22 may be over etched, and an undercut 24 is formed underlying the conductive pillar 22. In some embodiments, no undercut is formed. In some embodiments, the width W1 of the undercut 24 ranges from 0 to 0.5 μm, such as 0.2 μm. However, the disclosure is not limited thereto.

Referring to FIG. 1D, the undercut 24 is located between the conductive pillar 22 and the passivation layer 17. The sidewalls of the seed layer 19a are not aligned with, but are staggered with the sidewalls of the conductive pillar 22 vertically, e.g., in a direction perpendicular to the top surface of the substrate 13. The conductive pillar 22 is laterally protruding from the seed layer 19a. In other words, the sidewall of the seed layer 19a is closer to a center line of the connector 25 than the sidewall of the conductive pillar 22 is in the horizontal direction.

In some embodiments, the conductive pillar 22 includes a first portion P1 and a second portion P2 on the first portion P1. The first portion P1 is located in the opening 18 of the passivation layer 17 and surrounded by the seed layer 19a. The sidewalls of the first portion P1 are covered by and in contact with the seed layer 19a. In some embodiments, the shape of the first portion P1 may be a cylinder or a truncated cone tapered toward the top surface of the substrate 13. The cross-section shape of the first portion P1 may be square, rectangle, inverted trapezoid or the like. The second portion P2 is located on the first portion P1 and the seed layer 19a, the sidewalls of the second portion P2 laterally extends beyond the sidewalls of the seed layer 19a. In some embodiments, the shape of the second portion P2 is cylinder, the cross sectional shape of the second portion P2 may be square or rectangle, but the disclosure is not limited thereto.

In some embodiments, the width W2 of the seed layer 19a is less than the width W3 of the conductive pillar 22. The width W2 of the seed layer 19a refers to the distance between opposite ends of the seed layer 19a on the top surface of the passivation layer 17, that is, the largest width of the seed layer 19a in the horizontal direction parallel with the top surface of the substrate 13. The width W3 of the conductive pillar 22 refers to the width W3 of the second portion P2. The difference between the width W2 of the seed layer 19a and the width W3 of the second portion P2 equal to the width W1 of the undercut 24.

Still referring to FIG. 1D, the test pads 23 are electrically connected to the connectors 25, and further electrically connected to the pads 16 and the interconnection structure 15 through the connectors 25. Probes 26 may be used to electrically couple to the test pads 23 for wafer or die testing to check whether the die is a good die. In some embodiments, the testing is also referred to as wafer acceptance testing (WAT). In some embodiments, the test pad 23 is used for electrical testing to check whether the die 30 is a good die, but the disclosure is not limited thereto. The test pads 23 may be selected to test different properties of the wafer or the die, such as leakage current, breakdown voltage, threshold voltage and effective channel length, saturation current, contact resistance and connections.

Figure 1E:
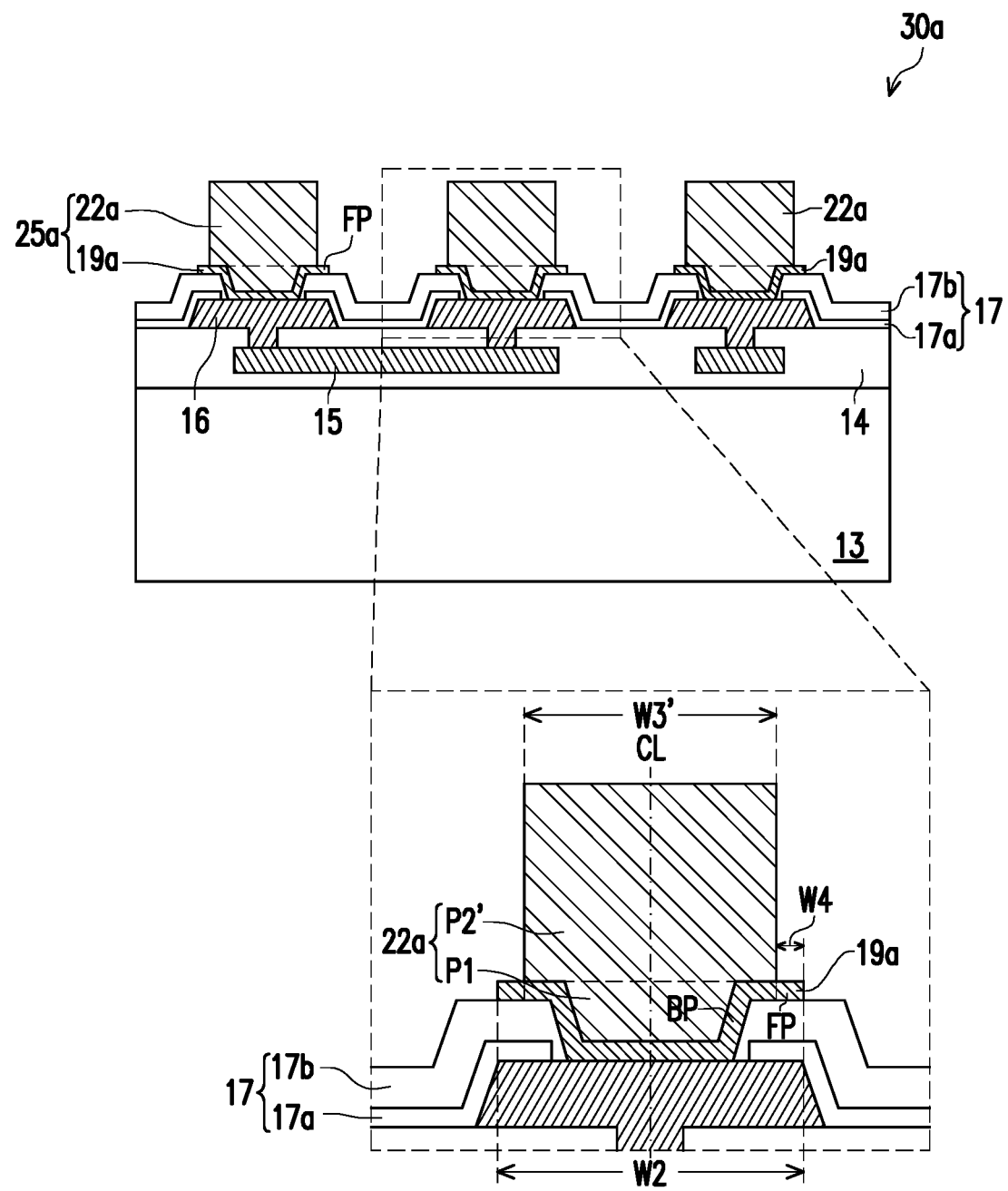

Referring to FIG. 1D and FIG. 1E, after the testing is done, a removal process is performed to remove the test pads 23. In some embodiments, the removal process includes wet etching using $H_2SO_4$ based etchant, $HNO_3$ based etchant, a combination thereof or the like. In some embodiments, the etchant may include nitric acid, ferric nitrate solution, and methanesulfonic acid for example. In the embodiments of the disclosure, test pads are removed after the die testing and before the subsequent formation of a protection layer, thus avoiding the potential issues that may be caused by the solder residue of the test pad in subsequent processes.

In some embodiments, the conductive pillar 22 is partially consumed during the etching process of the test pads 23. In some embodiments, the etching process is performed with a low etching selectivity ratio of the test pad 23 to the conductive pillar 22, and with a high etching selectivity ratio of the test pad 23 to the seed layer 19. That is, during the etching process of the test pads 23, the etching selectivity ratio of the test pad 23 to the conductive pillar 22 is less than the etching selectivity ratio of the test pad 23 to the seed layer 19a. In some embodiments, the etching selectivity ratio of the test pad 23 to the conductive pillar 22 ranges from 100 to 500, the etching selectivity ratio of the test pad 23 to the seed layer 19 ranges from 500 to 3000, the etching selectivity ratio of the seed layer 19 to the conductive pillar 22 ranges from 0 to 0.2, for example. However, the disclosure is not limited thereto.

As such, during the etching process of the test pads 23, the second portion P2 of the conductive pillar 22 is also etched and partially consumed, and a conductive pillar 22a including the first portion P1 and a second portion P2' is formed. The first portion P1 is not etched because it is surrounded by the seed layer 19a and covered by the second portion P2 during the etching process. In some embodiments, the seed layer 19a is substantially not etched. The seed layer 19a and the conductive pillar 22a form a connector 25a.

Referring to FIG. 1D and FIG. 1E, in some embodiments, sidewalls of the conductive pillar 22 are consumed. The sidewalls of the conductive pillar 22a may be straight or inclined. Top surfaces of the conductive pillar 22 may or may not be consumed. The conductive pillar 22a has a reduced size compared to the conductive pillar 22. Specifically, the second portion P2' has a reduced width W3' which is less than the width W3 of the second portion P2 prior to the etching process. The height of the second portion P2' may be not reduced or slightly reduced, that is, the height of the second portion P2' may be the same as or less than the height of the second portion P2. In some embodiments, the ratio of the width W3' to the width W3 is less than 1 and ranges from 0.95 to 1, for example. In some embodiments, the surface of the second portion P2' of the conductive pillar 22a may be flat or uneven. The cross-section shape of the second portion P2' of the conductive pillar 22a may be square, rectangle, trapezoid, or other suitable shape, and the disclosure is not limited thereto.

Still referring to FIG. 1E, in some embodiments, after the etching process of the test pads 23 is performed, the width W3' of the second portion P2 of the conductive pillar 22a is less than the width W2 of the seed layer 19a, such that a portion of the seed layer 19a is laterally protruding from the sidewall of the second portion P2' of the conductive pillar 22a, and the portion of the seed layer 19a is also refer to as a footing portion FP of the seed layer 19a.

In other words, the seed layer 19a includes a body portion BP and a footing portion FP connected to each other. The body portion BP surrounds the first portion P1 of the conductive pillar 22a and underlying the second portion P2' of the conductive pillar 22a. The surface of the body portion BP is covered by and in contact with the conductive pillar 22a. The footing portion FP is located on the top surface of the passivation layer 17 and surrounds the body portion BP. The footing portion FP is exposed by the conductive pillar 22a, laterally extending beyond and protruding from the sidewall of the second portion P2' of the conductive pillar 22a.

In some embodiments, when the seed layer 19a and the conductive pillar 22a are projected onto the top surface of substrate 13, the projection of footing portion FP of the seed layer 19a is ring-shaped from a top-view perspective and surrounds the projection of conductive pillar 22a. That is to say, the sidewall of the seed layer 19a is more distant from the center line CL of the connector 25a than the sidewall of the conductive pillar 22a in the horizontal direction. The cross-sectional shape of the footing portion FP may be square, rectangle, trapezoid, or the like, or any other kind of suitable shape, and the disclosure is not limited thereto. In some embodiments, the surface of the footing portion FP may be flat or uneven. The top surface of the footing portion FP may be concave, convex, undulated, or the like, and the disclosure is not limited thereto.

In some embodiments, the ratio of the width W3' of the conductive pillar 22a to the width W2 of the seed layer 19a is less than 1 and ranges from 0.95 to 1, for example. In some embodiments, the width W4 of the footing portion FP of the seed layer 19a ranges from 0.1 μm to 0.5 μm, or 0.1 μm to 1 μm, such as 0.2 μm. In other words, the connector 25a includes the seed layer 19a and the conductive pillar 22a, and has a stepped structure. Specifically, the edge of the connector 25a located on the passivation layer 17 includes a stepped structure.

Referring to FIG. 1E, in some embodiments, a die 30a is thus completed. In some embodiments, after the connectors 25a are formed, the wafer including the dies 30a is singulated by a die-saw process, and a plurality of dies 30a having the structure shown in FIG. 1E are formed. The die 30a includes the substrate 13, the dielectric structure 14, the interconnection structure 15, the pads 16, the passivation layer 17 and the connectors 25a. The connector 25a includes the seed layer 19a and the conductive pillar 22a, and the seed layer 19a includes a footing portion FP laterally protruding from the sidewall of the conductive pillar 22a.

Figure 1F:
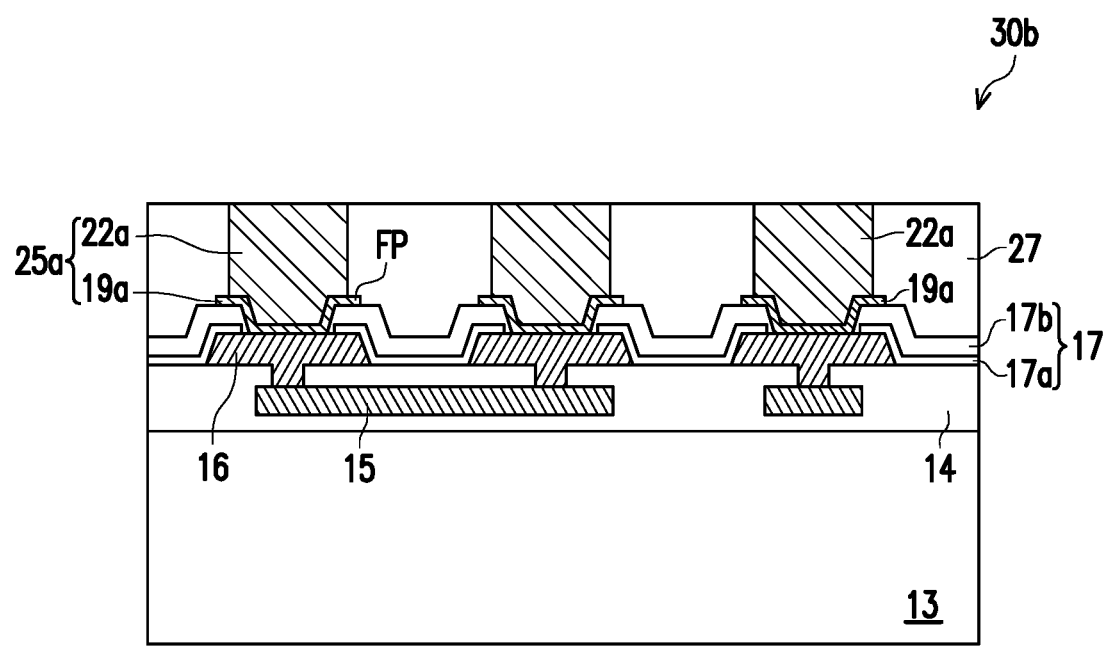

Referring to FIG. 1E to FIG. 1F, in some other embodiments, before the die-saw process is performed, a protection layer 27 is further formed on the passivation layer 17 and laterally surrounding the connectors 25a, and a die 30b further including the protection layer 27 is thus formed. The protection layer 27 may be a polymer layer, such as a low temperature polymer layer or a high temperature polymer layer. In some embodiments, the protection layer 27 includes PI such as a low temperature PI (LTPI), PBO such as high temperature PBO (HTPBO), BCB, combinations thereof or the like. The material of the protection layer 27 may be the same as or different from that of the second passivation sublayer 17b.

In some embodiments, the protection layer 27 may be formed by the following processes: a protection material layer is formed on the passivation layer 17 and on the connectors 25a by a spin coating process, for example. The protection material layer covers the top surface of passivation layer 17 and the top surfaces of the connectors 25a. A curing process is then performed to cure the protection material layer. In some embodiments in which both the second passivation sublayer 17b and the protection layer 27 are made from PI, the temperature of the curing process of the protection layer 27 is lower than that of the second passivation sublayer 17b. In some embodiments, the temperature of the curing process of the protection material layer is between 170° C. to 320° C., such as 230° C. In some embodiments in which the protection layer 27 includes LTPI, the bubble issue is avoided. In some embodiments, after the curing process is performed, a planarization process such as a chemical mechanical polishing (CMP) process is performed to remove a portion of the protection material layer on the top surfaces of the connectors 25a, so as to form the protection layer 27. In some embodiments, the top surface of the protection layer 27 is substantially coplanar with the top surfaces of the connectors 25a.

Still referring to FIG. 1F, the sidewalls of the connectors 25a are surrounded by and in contact with the protection layer 27. The top surface and sidewall of the footing portion FP of the seed layer 19a are covered by and in contact with the protection layer 27.

Figure 1G:
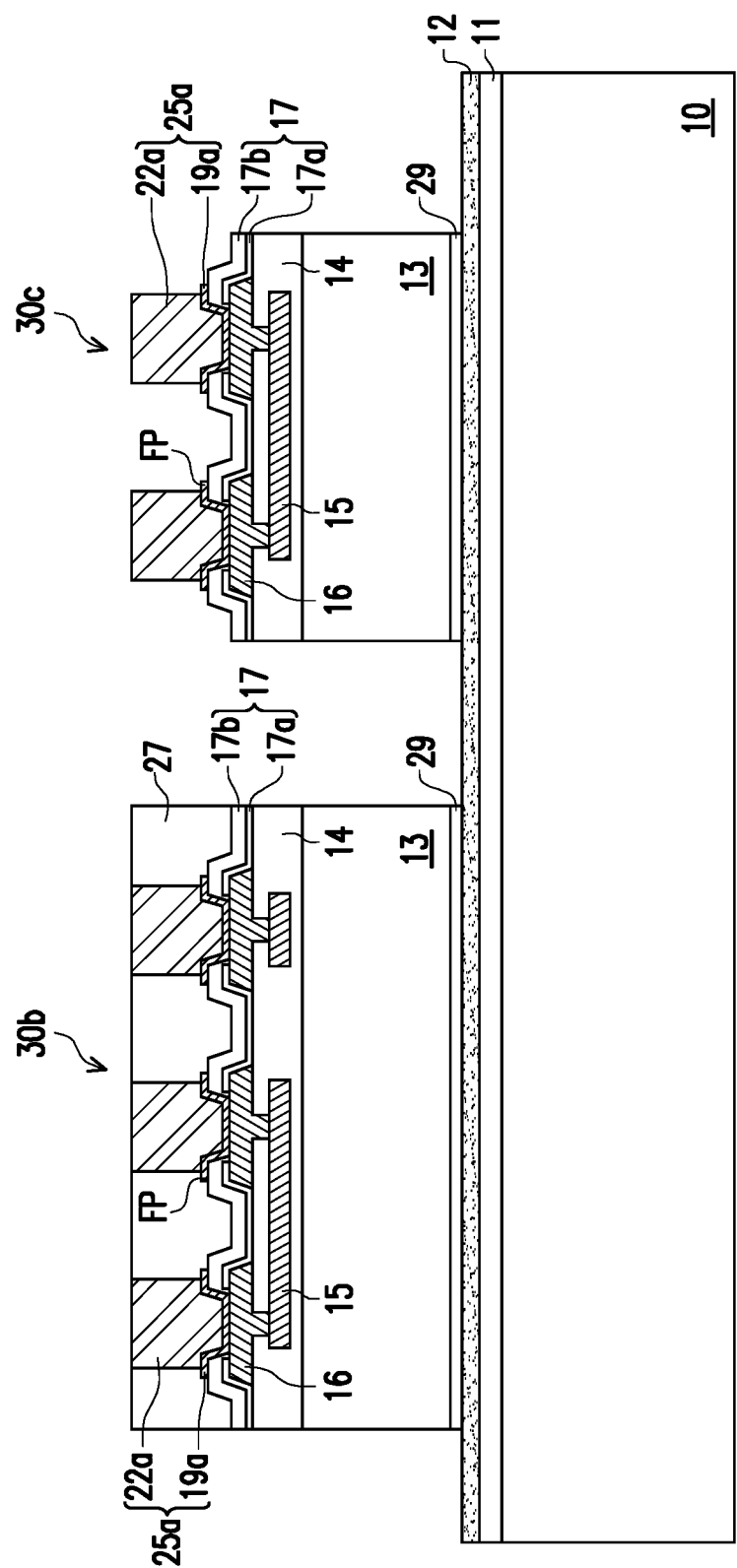

Referring to FIG. 1G, one or more dies, such as the die 30b and a die 30c formed by the foregoing processes are mounted to a carrier 10. The carrier 10 may be a glass carrier, a ceramic carrier, or the like. In some embodiments, the carrier 10 has a de-bonding layer 11 formed thereon. The de-bonding layer 11 is formed by, for example, a spin coating method. In some embodiments, the de-bonding layer 11 may be formed of an adhesive such as an Ultra-Violet (UV) glue, a light-to-heat conversion (LTHC) glue, or the like, or other types of adhesives. The de-bonding layer 11 is decomposable under the heat of light to thereby release the carrier 10 from the overlying structures that will be formed in subsequent steps.

A dielectric layer 12 is optionally formed on the de-bonding layer 11. In some embodiments, the dielectric layer 12 is a polymer layer. The polymer includes, for example, PI, PBO, BCB, Ajinomoto Buildup Film (ABF), Solder Resist film (SR), or the like. The dielectric layer 12 is formed by a suitable fabrication technique such as spin-coating, lamination, deposition, or the like.

In some embodiments, the die 30b and the die 30c are attached to the dielectric layer 12 through an adhesive layer 29 such as a die attach film (DAF), silver paste, or the like. Although two dies are illustrated, the disclosure is not limited thereto. In some other embodiments, one die or more than two dies may be mounted to the carrier 10.

In some embodiments, the die 30b and the die 30c may be any one of a system-on-chip (SoC) device, a memory device, an integrated passive device (IPD) or any other suitable types of devices, respectively. In some embodiments, the die 30b and the die 30c may respectively be an application-specific integrated circuit (ASIC) chip, an analog chip, a sensor chip, a wireless and radio frequency chip, a voltage regulator chip, a memory chip or the like. The die 30b and the die 30c may be the same types of dies or the different types of dies. In some embodiments, the die 30b is an SoC device and the die 30c is an IPD device, for example. In some embodiments, the two dies 30b and 30c are two small die partitions with different function of a larger single die. The sizes (refers to the height and/or the width) of the two dies 30b and 30c may be the same or different.

In some embodiments, the die 30c has substantially the same structure as the die 30a shown in FIG. 1E except the die 30c includes a different number of connectors 25a. It is understood that, the number of the connectors 25a shown in the die 30a, 30b, 30c is merely for illustration, and the disclosure is not limited thereto.

Still referring to FIG. 1G, similar to the die 30a or 30b, the die 30c includes the substrate 13, the dielectric structure 14, the interconnection structure 15, the pads 16, the passivation layer 17, and the connectors 25a. In some embodiments, the die 30b includes the protection layer 27, and the die 30c does not include the protection layer 27. That is, the top surfaces and sidewalls of the connectors 25a of the die 30c are exposed. However, the disclosure is not limited thereto. In some other embodiments, both the die 30b and the die 30c include the protection layer 27. In alternative embodiments, both the die 30b and the die 30c are free of the protection layer 27.

Figure 1H:
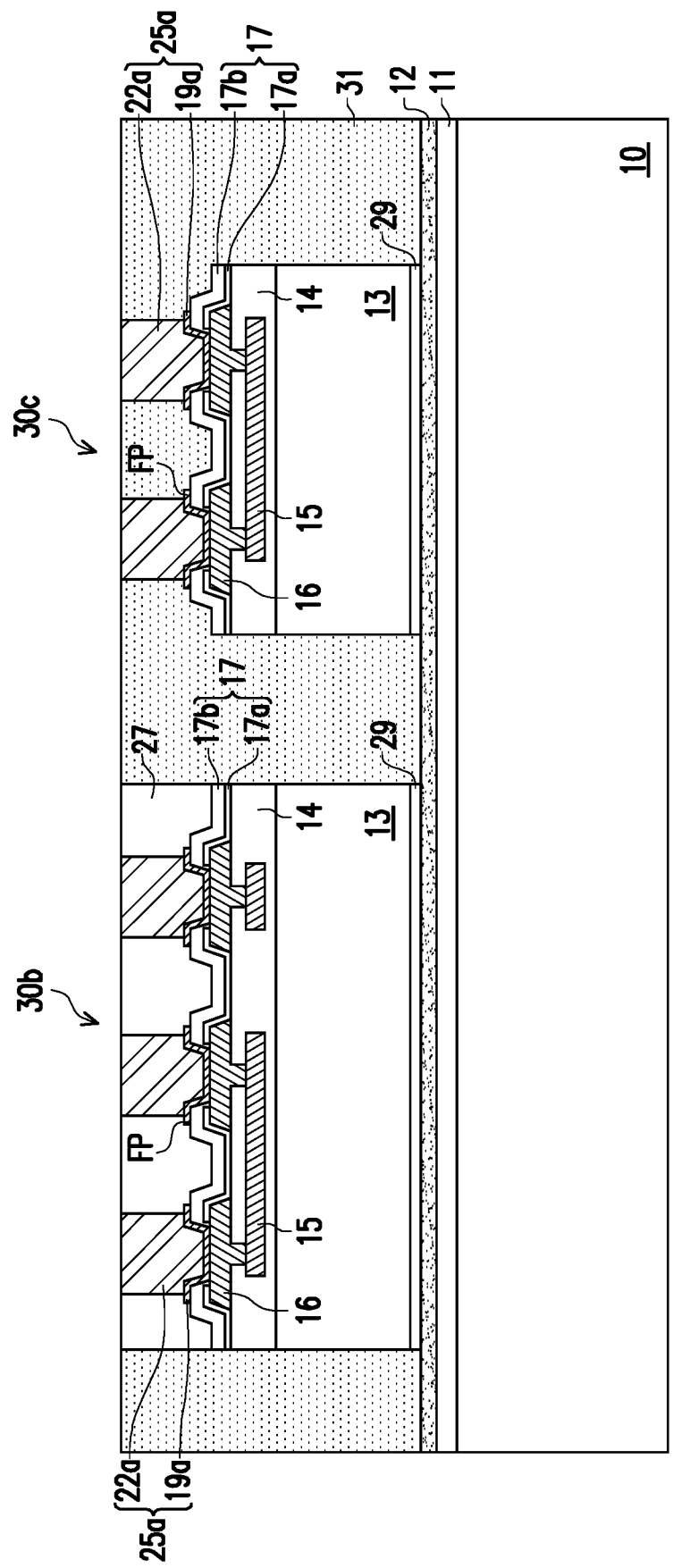

Referring to FIG. 1H, an encapsulant 31 is then formed over the carrier 10 to encapsulate the sidewalls of the dies 30b and 30c. In some embodiments, the encapsulant 31 includes a molding compound, a molding underfill, a resin such as epoxy, a combination thereof, or the like. In some other embodiments, the encapsulant 31 includes a photo-sensitive material such as PBO, PI, BCB, a combination thereof, or the like, which may be easily patterned by exposure and development processes or laser drilling process. In alternative embodiments, the encapsulant 31 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 31 is formed by forming an encapsulant material layer over the carrier 10 by a suitable fabrication technique such as spin-coating, lamination, deposition, or similar processes. The encapsulant material layer encapsulates the top surfaces and sidewalls of the dies 30b and 30c. Thereafter, a planarization process such as a grinding or polishing (such as CMP) process is performed to remove a portion of the encapsulant material layer, such that the top surfaces of the connectors 25a are exposed. In some embodiments, the top surfaces of the connectors 25a and the encapsulant 31 are substantially coplanar.

Still referring to FIG. 1H, the encapsulant 31 is laterally aside the dies 30b and 30c, surrounding and covering sidewalls of the dies 30b and 30c. In the die 30b, the connectors 25a are surrounded by the protection layer 27, and the sidewalls of the protection layer 27 is covered by and in contact with the encapsulant 31. A portion of the encapsulant 31 is formed on the passivation layer 17, surrounding and contacting with sidewalls of the connectors 25a of the die 30c. In the die 30c, the seed layer 19a and the sidewalls of the conductive pillar 22a are in contact with the encapsulant 31. The top surface and sidewalls of the footing portion FP of the seed layer 19a are covered by and in contact with the encapsulant 31.

Figure 1I:
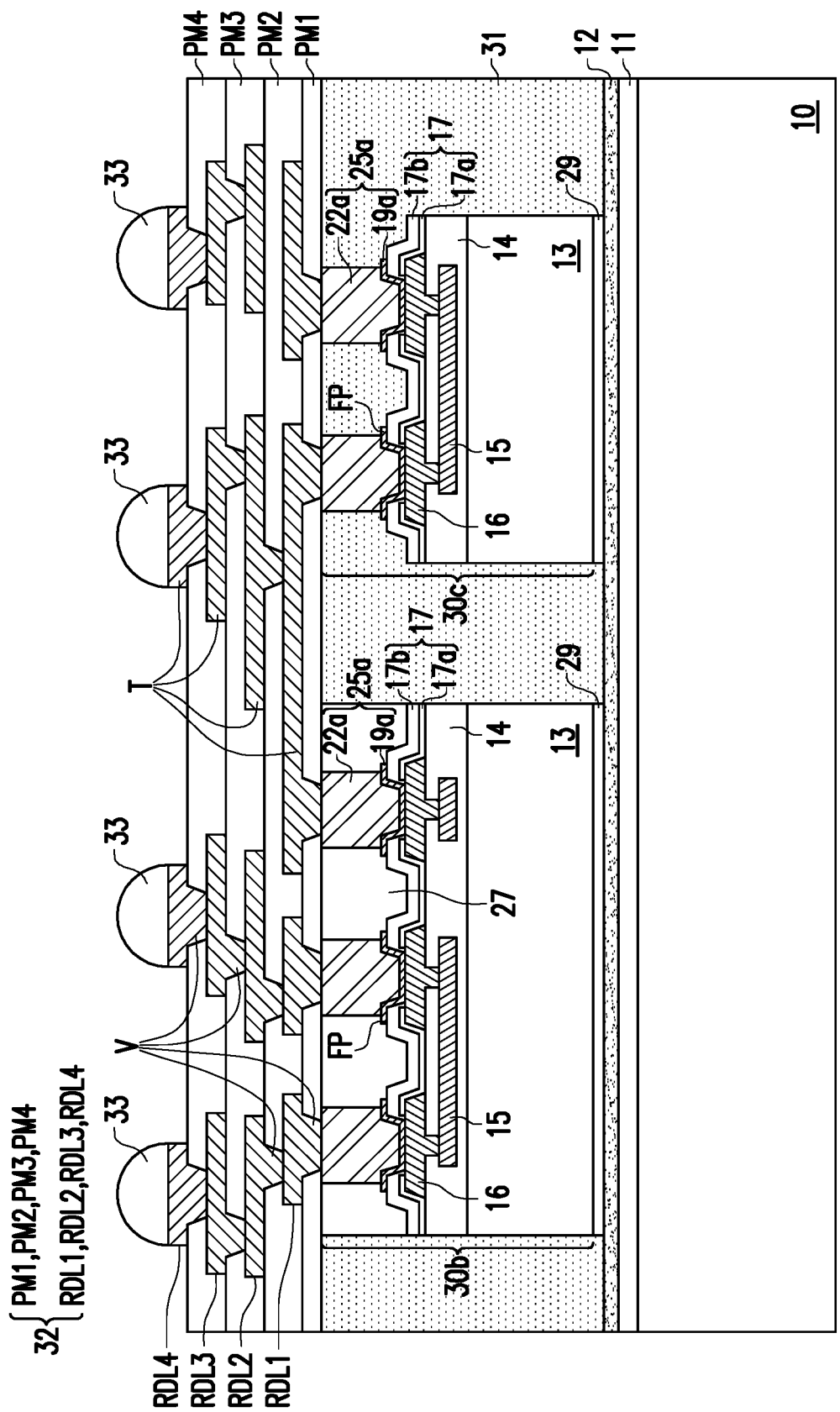

Referring to FIG. 1I, a redistribution layer (RDL) structure 32 is formed over and electrically connected to the dies 30b and 30c. In some embodiments, the die 30b and the die 30c are electrically connected to each other through the RDL structure 32. In some embodiments, the RDL structure 32 is referred as a "front-side redistribution layer structure", wherein the "front-side" refers to a side close to the connectors 25a of the dies 30b and 30c. In some embodiments, the RDL structure 32 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

The redistribution layer RDL1 penetrates through the polymer layer PM1 and is physically and electrically connected to the connectors 25a of the dies 30b and 30c. The redistribution layer RDL2 penetrates through the polymer layer PM2 and is electrically connected to the redistribution layer RDL. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3.

The material of the polymer layer PM1, PM2, PM3, PM4 may be the same as or different from the material of the protection layer 27 of the die 30b, or the material of the encapsulant 31. In some embodiments, each of the polymer layers PM1, PM2, PM3 and PM4 includes a photo-sensitive material such as PBO, PI, BCB, a combination thereof or the like. In some embodiments, the protection layer 27 is also referred to as a polymer layer PM0.

In some embodiments, each of the redistribution layers RDL1, RDL2, RDL3 and RDL4 includes conductive materials. The conductive materials includes metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metallic seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layers RDL1, RDL2, RDL3 and RDL4 respectively includes a plurality of vias V and a plurality of traces T connected to each other. The vias V vertically penetrate through the polymer layers PM1, PM2, PM3 and PM4 to connect the traces T of the redistribution layers RDL1, RDL2, RDL3 and RDL 4, and the traces T are respectively located on the polymer layers PM1, PM2, PM3 and PM 4, and are respectively horizontally extending on the top surface of the polymer layers PM1, PM2, PM3 and PM4.

In some embodiments, the redistribution layer RDL4 is the topmost redistribution layer of the RDL structure 32, and is referred to as an under-ball metallurgy (UBM) layer for ball mounting.

Still referring to FIG. 1I, thereafter, a plurality of connectors 33 are formed over and electrically connected to the redistribution layer RDL4 of the RDL structure 32. In some embodiments, the connectors 33 are referred as conductive terminals. In some embodiments, the connectors 33 may be ball grid array (BGA) connectors, solder balls, controlled collapse chip connection (C4) bumps, or a combination thereof. In some embodiments, the material of the connector 33 includes copper, aluminum, lead-free alloys (e.g., gold, tin, silver, aluminum, or copper alloys) or lead alloys (e.g., lead-tin alloys). The connector 33 may be formed by a suitable process such as evaporation, plating, ball dropping, screen printing and reflow process, a ball mounting process or a C4 process. In some embodiments, metal posts or metal pillars may further be formed between the redistribution layer RDL4 and the connectors 33 (not shown). The connectors 33 are electrically connected to the connectors 25a of the two dies 30b and 30c through the RDL structure 32.

Figure 1J:
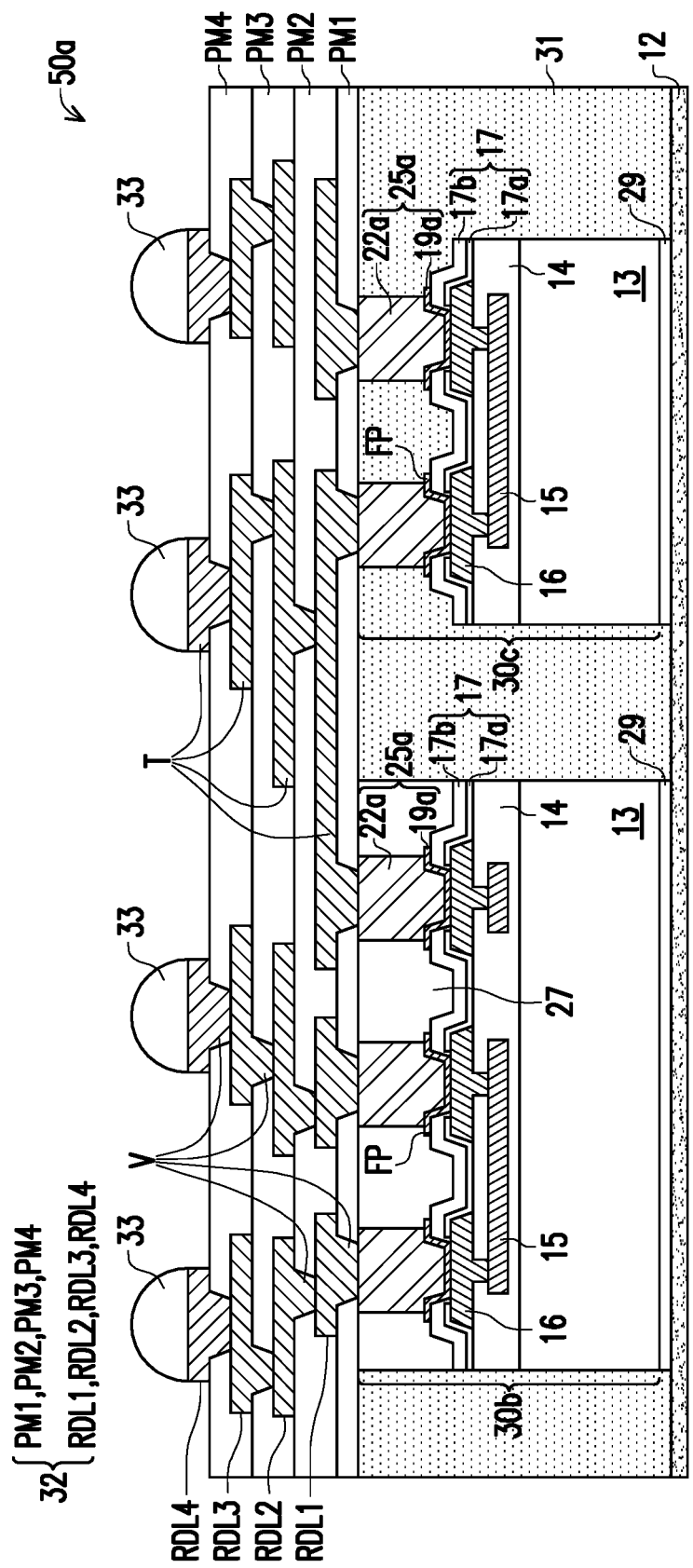

Referring to FIG. 1I and FIG. 1J, the de-bonding layer 11 is decomposed under the heat of light, and the carrier 10 is then released. The dielectric layer 12 may be optionally remained.

Referring to FIG. 1J, a package structure 50a is thus completed. The package structure 50a is also referred as a fan-out package structure. The package structure 50a includes the two dies 30b and 30c, the encapsulant 31, the RDL structure 32 and the connectors 33. The die 30b and the die 30c are connected through the RDL structure 32. The dies 30b and 30c include the connectors 25a, respectively. The connector 25a is in electrical contact with the pads 16, and further electrically connected to the interconnection structure 15 of the die 30b or 30c. The connector 25a of the die 30b or 30c includes the seed layer 19a and the conductive pillar 22a on the seed layer 19a. The seed layer 19a includes the body portion covered by the conductive pillar 22a and the footing portion FP protruding from sidewalls of the conductive pillar 22a. The conductive pillar 22a covers a portion of the top surface of the seed layer 19a and exposes the footing portion FP of the seed layer 19a. In some embodiments, the top surface and sidewalls of the footing portion FP is covered by and in physical contact with the protection layer 27 (such as the die 30b). In some embodiments, the top surface and sidewalls of the footing portion FP is covered by and in physical contact with the encapsulant 31 (such as the die 30c).

Figure 2:
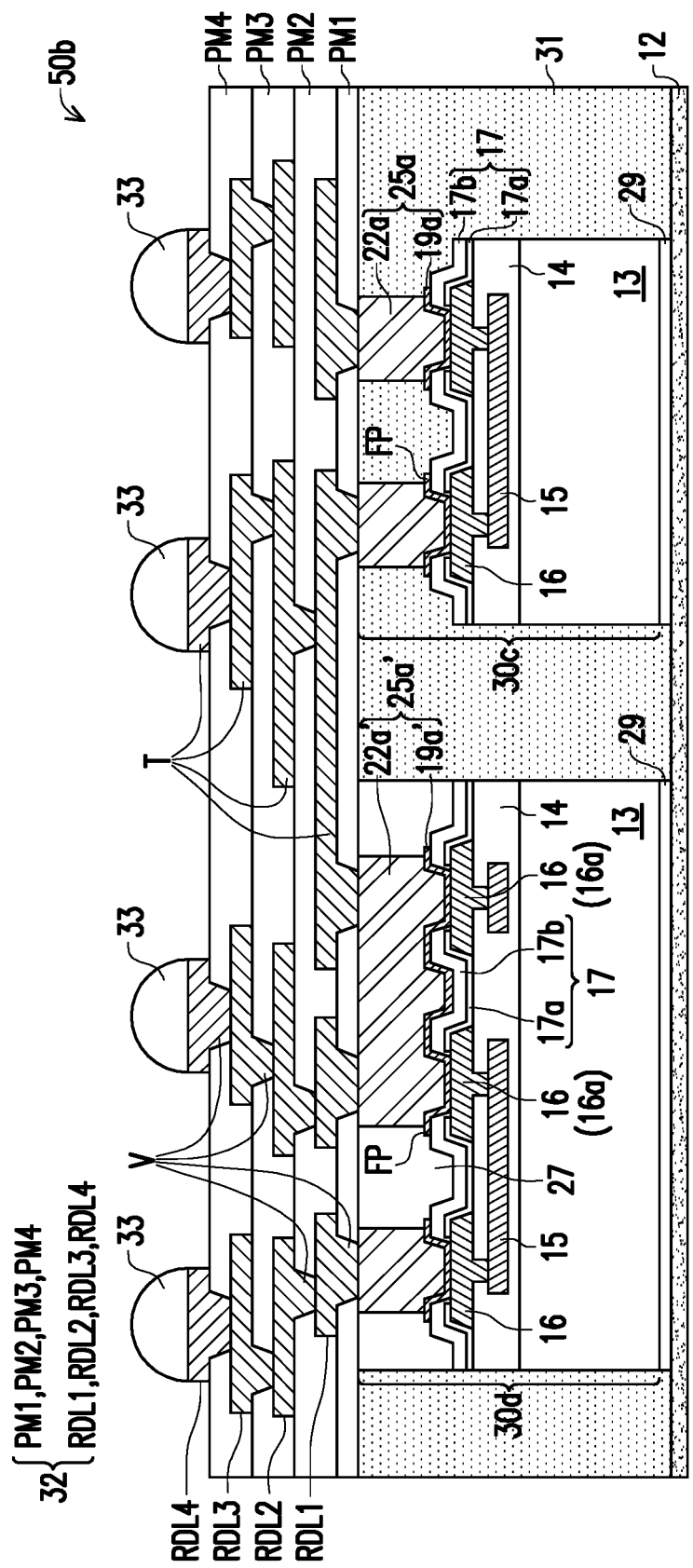
FIG. 2 to FIG. 4 are schematic cross-sectional views respectively illustrating a package structure according to some embodiments of the disclosure.

In the forgoing embodiment, one connector 25a is corresponding to one pad 16 in the die 30a, 30b or 30c, but the disclosure is not limited thereto. FIG. 2 illustrates a package structure 50b including a die 30d having a line connector 25a' corresponding to two pads 16. In some embodiments, as shown in FIG. 2, the package structure 50b includes the die 30d and the die 30c. The package structure 50b is similar to the package structure 50a, except that the die 30d includes a connector 25a' different from the connector 25a.

Referring to FIG. 2, the die 30d includes the connector 25a and the connector 25a'. In some embodiments, the connector 25a' is formed on two pads 16, such as the two pads 16a shown in FIG. 2. The connector 25a' is in electrical and physical contact with the two pads 16, extending from a position over a first pad 16 to a position over a second pad 16 and covers the passivation layer 17 between the two pads 16. The top surface of passivation layer 17 between the two pads 16 is covered by and in contact with the connector 25a'. In some embodiments, the connector 25a' includes a seed layer 19a' and a conductive pillar 22a'. The seed layer 19a' and the conductive pillar 25a' extend from a position over a first pad 16 to a position over a second pad 16 and covers the passivation layer 17 between the two pads 16. The seed layer 19a' includes a body portion underlying the conductive pillar 22a' and a footing portion FP protruding form sidewalls of the conductive pillar 22a'. The conductive pillar 22a' is located on the seed layer 19a' and covers a portion of the top surface of the seed layer 19a', and exposes the footing portion FP of the seed layer 19a'. Although the connector 25a' is illustrated to connect to two pads 16, the disclosure is not limited thereto. The connector 25a' may be connected to more than two pads 16 according to the product design. In some embodiments, the connector 25a' is also referred to as line connector or line via. Comparing to the connector 25a, the connector 25a' is connected to more pads 16 and have a larger area, as such, the connector 25a' may be used for transmitting larger or increased signal, the heat dissipation thereof is better and the electrical resistance thereof is reduced. The other features of the die 30d are substantially the same as the die 30a, 30b or 30c, and are not described again here. It should be noted that, the die 30c may also include the line connectors 25a'.

Figure 3:
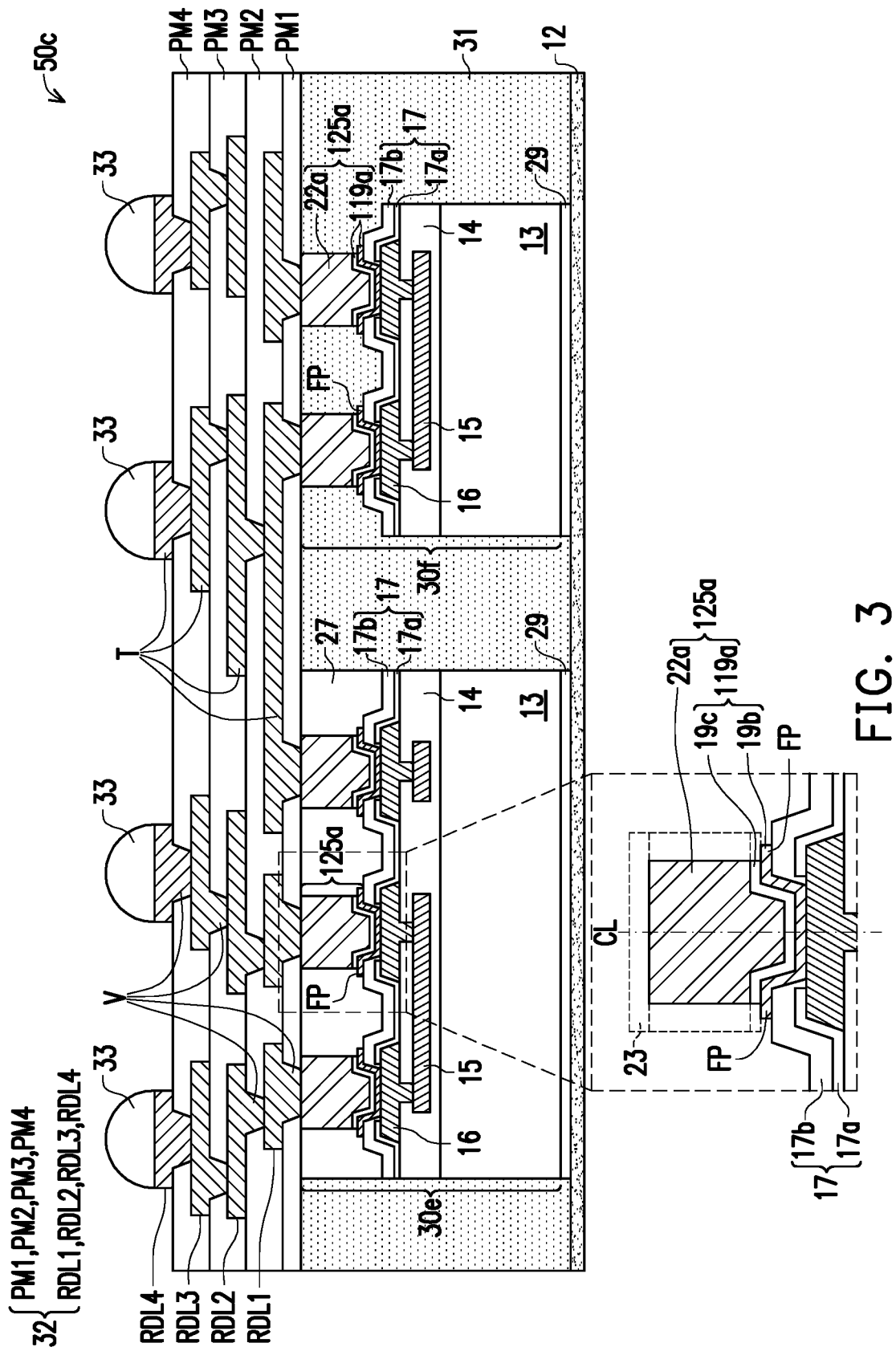

FIG. 3 illustrates a package structure 50c including a die 30e and a die 30f, wherein a seed layer 119a of a connector 125a of the die 30e or 30f comprises a bi-layer structure. The package structure 50c has a structure similar to the package structure 50a (shown in FIG. 1J), except that the structure of connector 125a of the dies 30e and 30f is different from that of the connector 25a of the dies 30b and 30c.

Referring to FIG. 3, in some embodiments, the seed layer 119a is a bi-layer structure including a first seed sublayer 19b and a second seed sublayer 19c on the first seed sublayer 19b. In some embodiments, the second seed sublayer 19c includes a material different from the material of the first seed sublayer 19b and the same as the material of the conductive pillar 22a. For example, the first seed sublayer 19b is a titanium layer, the second seed sublayer 19c is a copper layer, and the conductive pillar 22a is a copper pillar. The first seed sublayer 19b and the second sublayer 19c may be formed by PVD such as sputtering, electroplating, electroless plating, or a combination thereof.

Referring to FIG. 1D, FIG. FIG. 1E and FIG. 3, the dotted lines in the enlarged view of FIG. 3 illustrate the structure of the seed layer and the conductive pillar before the etching process of the test pad 23 is performed. As shown in the enlarged view of FIG. 3, before the etching process of the test pad 23, the undercut may be located between the second seed sublayer 19c and the passivation layer 17, and the sidewalls of the second seed sublayer 19c may be aligned with sidewalls of the conductive pillar 22. During the etching process of the test pads 23, the second seed sublayer 19c may also be etched and partially consumed since it includes a same material as the conductive pillar 22a, the first seed sublayer 19b is substantially not etched, and a seed layer 119a including the first seed sublayer 19b and the second seed sublayer 19c is formed. The seed layer 119a and the conductive pillar 22a form the connector 125a.

Referring to FIG. 3, in some embodiments, the sidewalls of the second seed sublayer 19c are substantially aligned with the sidewalls of the conductive pillar 22a. The first seed sublayer 19b extends beyond and protruding from sidewalls of the second seed sublayer 19c and the sidewalls of the conductive pillar 22a. The first seed sublayer 19b includes a footing portion FP laterally extends beyond the sidewalls of the second seed sublayer 19c and the conductive pillar 22a. When the seed sublayers 19b and 19c and the conductive pillar 22a are projected onto the top surface of substrate 13, the projection of the footing portion FP of the first seed sublayer 19b surrounds the projection of the second seed sublayer 19c and the projection of the conductive pillar 22a. That is to say, the second seed sublayer 19c and the conductive pillar 22a cover a portion of the top surface of the first seed sublayer 19b and expose the footing portion FP of the first seed sublayer 19b.

In other words, (the edge of) the seed layer 119a includes a stepped structure on the passivation layer 17, and the sidewall of the second seed sublayer 19c is closer to the center line of the connector 125a than the sidewall of the first seed sublayer 19b is in a horizontal direction parallel to the top surface of the substrate 13. In some embodiments in which the die includes the protection layer 27, as illustrated as the die 30e, the top surface and sidewalls of the footing portion FP of the first seed sublayer 19b is covered by and in contact with the protection layer 27. The top surface of the second seed sublayer 19c is covered by the conductive pillar 22a. In some embodiments, the top surface of the second seed sublayer 19c is completely covered by the conductive pillar 22a. The sidewalls of the second seed sublayer 19c are covered by and in contact with the protection layer 27. In some other embodiments in which a die is free of a protection layer, as illustrated as the die 30f, the top surface and sidewalls of the footing portion FP of the first seed sublayer 19b is covered by and in contact with the encapsulant 31. The top surface of the second seed layer 19c is covered by the conductive pillar 22a. In some embodiments, the top surface of the second seed sublayer 19c is completely covered by the conductive pillar 22a. The sidewalls of the second seed sublayer 19c are covered by and in contact with the encapsulant 31.

Figure 4:
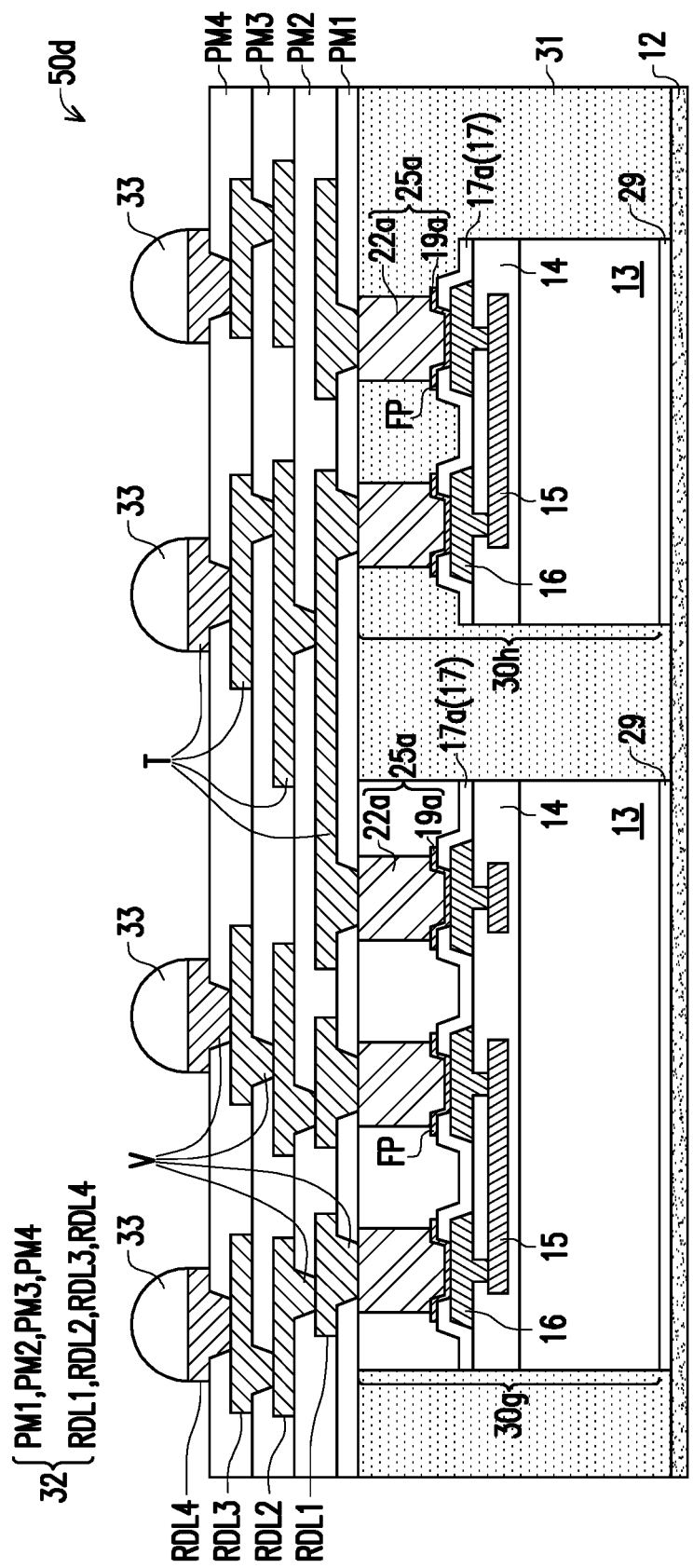

FIG. 4 illustrates a package structure 50d including a die 30g and a die 30h without a second passivation sublayer. Referring to FIG. 4, the die 30g and the die 30h are respectively similar to the die 30b and the die 30c (FIG. 1J), and the difference lies in that the passivation layers 17 of the dies 30g and 30h are single-layer structure. As shown in FIG. 4, in some embodiments, the passivation layer 17 includes the first passivation sublayer 17a and does not includes the second passivation sublayer 17b (FIG. 1J). The size (such as thickness) and shape of first passivation sublayer 17a in this embodiment may be the same as or different from those of the first passivation sublayer 17a illustrated in the figures (such as FIG. 1J) of foregoing embodiments. The other features of the package structure 50d are substantially the same as those of the package structure 50a, which are not described again. It is noted that, although connectors 25a is illustrated in FIG. 4, other kinds of connectors such as the connector 25a' or the connector 125a may also be applied to the package structure 50d.

Figure 5:
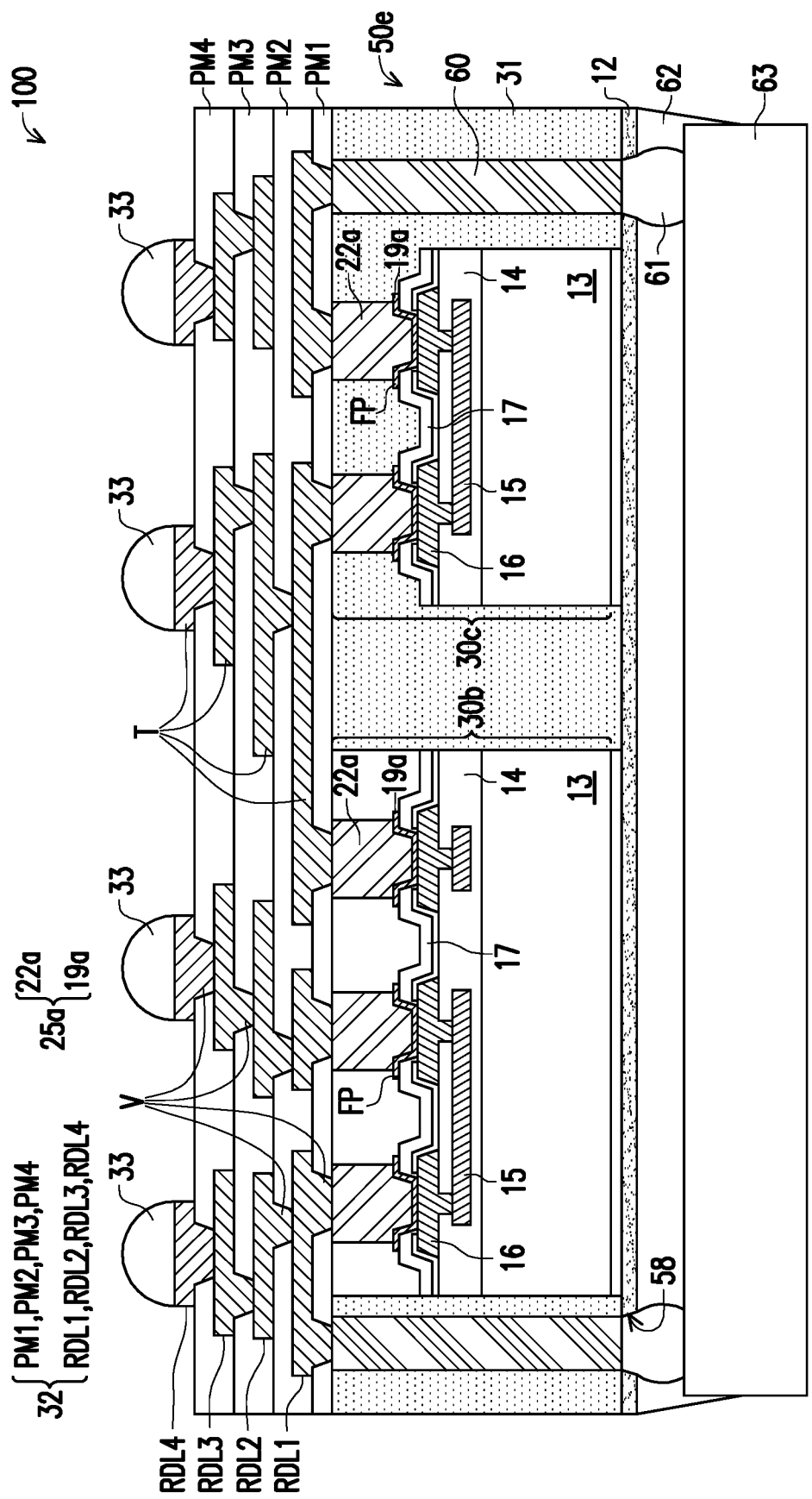
FIG. 5 is a schematic cross-sectional view of a PoP device according to some embodiments of the disclosure.

FIG. 5 illustrate a package structure 50e including through integrated fan-out vias (TIVs) 60 and a package on package (PoP) structure 100.

Referring to FIG. 1G to FIG. 1H and FIG. 5, in some embodiments, before the encapsulant 31 is formed, TIVs 60 may be formed on the dielectric layer 12 and laterally aside or around the dies 30b and 30c. In some embodiments, the TIVs 60 include copper, nickel, solder, alloys thereof, or the like. In some embodiments, the TIV 60 includes a seed layer and a conductive layer formed thereon (not shown). The seed layer is, for example, a titanium or/and copper composited layer. The conductive layer is, for example, a copper layer. An illustrative forming method of the TIVs 60 includes forming a photoresist layer such as a dry film resist over the carrier 10 before the dies 30b and 30c are attached. Thereafter, openings are formed in the photoresist layer, the openings exposes a portion of the top surface of the dielectric layer 12, and the TIVs 60 are then formed in the openings by plating. In some other embodiments, the TIVs 60 further include a barrier layer (not shown) under the seed layer to prevent metal diffusion. The material of the barrier layer includes, for instance, metal nitride such as titanium nitride, tantalum nitride, or a combination thereof.

Referring FIG. 5, the sidewalls of the TIVs 60 are encapsulants by the encapsulant 31. The redistribution layer RDL1 is electrically connected to the TIVs 60, such that the TIVs 60 are electrically connected to the dies 30b and 30c through the RDL structure 32. The other features of the package structure 50e are substantially the same as those of the package structure 50a, which are not described again.

Still referring to FIG. 5, in some embodiments, the package structure 50e may further be electrically coupled to a package structure 63 to form a package-on-package (POP) device 100, but the disclosure is not limited thereto.

In some embodiments, after the package structure 50e is formed, the dielectric layer 12 may be patterned to form openings 58 by laser drilling process, for example. The openings 58 expose portions of the bottom surfaces of the TIVs 60. Thereafter, connectors 61 fill into the openings 58 of the dielectric layer 12, so as to electrically connect the TIVs 60 of the package structure 50e to the package structure 63. The package structure 63 may be any kind of package structures according to the functional demand of the PoP device 100. In some embodiments, the package structure 63 may be dynamic random access memory (DRAM), static random access memory (SRAM), and the like or other kind of package.

In some embodiments, an underfill layer 62 is further formed to fill the space between the package structure 50e and the package structure 63 and surround the connectors 61. The PoP device 100 including the package structure 50e and the package structure 63 is thus completed, wherein the package structure 50e and the package structure 63 are connected through the connectors 61. The PoP device 100 shown in FIG. 5 is merely for illustration, and the disclosure is not limited thereto. It should be noted that, the package structures 50b, 50c, 50d may also include TIVs and may further coupled to other packages to form PoP device.

In the foregoing embodiments, the combination of the dies packed in a package structure is merely for illustration, and the disclosure is not limited thereto. The dies 30a, 30b, 30c, 30d, 30e, 30f, 30g, 30h may be packed into a package structure individually or in any kind of combination. Further, although fan-out package structure is illustrated, the disclosure is not limited thereto. The dies 30a, 30b, 30c, 30d, 30e, 30f, 30g, 30h may also be used to form other kind of package structure, such as fan-in package.

In the embodiments of the disclosure, test pads are removed after the die testing and before forming the protection layer, thus avoiding the solder residue which may occur between the connector and the protection layer during the curing process of the protection layer. Therefore, the wettability and adhesion between the connector and the protection layer or the encapsulant is improved, and the performance and reliability of the die and the package structure is enhanced. In addition, the potential issues that may be caused by the solder residue during a defect scan are also avoided.

In accordance with some embodiments of the disclosure, a package structure includes a die, an encapsulant, a RDL structure, and a conductive terminal. The die has a connector. The connector includes a seed layer and a conductive on the seed layer. The seed layer extends beyond a sidewall of the conductive pillar. The encapsulant is aside the die and encapsulates sidewalls of the die. The RDL structure is electrically connected to the die. The conductive terminal is electrically connected to the die through the RDL structure.

In accordance with alternative embodiments, a die includes a substrate, a pad, and a connector. The pad is over the substrate. The connector is electrically connected to the pad. The connector includes a seed layer and a conductive pillar. The seed layer is on the pad. The conductive pillar is on the seed layer. The seed layer includes a footing portion surrounding the conductive pillar when projected to a top surface of the substrate.

In accordance with some embodiments, a method of forming a package structure comprises the following steps. A die is formed. An encapsulant is formed aside the die to encapsulate sidewalls of the die. An RDL structure is formed on the die and the encapsulant. A conductive terminal is formed to be electrically connected to the die through the RDL structure. Forming the die includes forming a connector on and electrically connected to a pad. The connector is formed by the following method. A seed layer is formed on the pad. A conductive pillar is formed on the seed layer. A test pad is formed on the conductive pillar. An electrical testing is performed through the test pad. An etching process is performed to remove the test pad. The conductive pillar is consumed during the etching process, such that a footing portion of the seed layer laterally protrudes from a sidewall of the conductive pillar.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die having a connector, the connector comprising:
   a seed layer; and
   a conductive pillar on the seed layer, wherein the seed layer extends beyond a sidewall of the conductive pillar, the seed layer comprises a footing portion, and the footing portion is laterally protruding from the sidewall of the conductive pillar;

an encapsulant aside the die, encapsulating sidewalls of the die, wherein a top surface and a sidewall of the footing portion is covered by the encapsulant;

a redistribution layer (RDL) structure, electrically connected to the die; and a conductive terminal, electrically connected to the die through the RDL structure.

2. The package structure of claim 1, further comprising an additional die laterally aside the die and encapsulated by the encapsulant, wherein the additional die has an additional connector comprising an additional seed layer and an additional conductive pillar on the additional seed layer, wherein the additional seed layer comprises an additional footing portion laterally protruding from a sidewall of the additional conductive pillar, wherein the additional die further comprises an additional protection layer laterally surrounding the additional connector, a top surface and a sidewall of the additional footing portion being covered by the additional protection layer of the additional die.

3. The package structure of claim 2, wherein the additional footing portion is located between a passivation layer of the additional die and the additional protection layer.

4. The package structure of claim 1, wherein the footing portion is located between a passivation layer of the die and the encapsulant.

5. The package structure of claim 1, wherein a width of the seed layer is larger than a width of the conductive pillar.

6. The package structure of claim 1, wherein the connector is electrically connected to two pads of the die.

7. The package structure of claim 1, wherein the seed layer comprises a first seed sublayer and a second seed sublayer on the first seed sublayer, and an edge of the seed layer comprises a stepped structure.

8. The package structure of claim 7, wherein a sidewall of the first seed sublayer is more distant from a center line of the connector than a sidewall of the second seed layer is from the center line of the connector.

9. A die, comprising:
a substrate;
a pad over the substrate; and
a connector, electrically connected to the pad, comprising:
a seed layer on the pad; and
a conductive pillar on the seed layer, wherein the seed layer comprises a footing portion laterally protruding from a sidewall of the conductive pillar, and a projection of the footing portion on a top surface of the substrate surrounds a projection of the conductive pillar on the top surface of the substrate; and
a protection layer, laterally surrounding the connector, wherein a top surface and a sidewall of the footing portion is covered by the protection layer.

10. The die of claim 9, wherein the connector is electrically connected to two pads of the die.

11. The die of claim 9, wherein the seed layer comprises a first seed sublayer and a second seed sublayer on the first seed sublayer, and an edge of the seed layer comprises a stepped structure.

12. The die of claim 9, wherein the footing portion of the seed layer is-sandwiched between the protection layer and a passivation layer covering the pad of the die.

13. The die of claim 9, wherein a sidewall of the footing portion is more distant from a center line of the connector than a sidewall of the conductive pillar from the center line of the connector in a horizontal direction.

14. The die of claim 9, wherein the protection layer comprises low temperature polyimide (PI) or high temperature polybenzoxazole (PBO).

15. A method of forming a package structure, comprising:
forming a die, comprising:
forming a connector on and electrically connected to a pad, comprising:
forming a seed layer on the pad;
forming a conductive pillar on the seed layer;
forming a test pad on the conductive pillar;
performing an electrical testing through the test pad; and
performing an etching process to remove the test pad, wherein the conductive pillar is consumed during the etching process, such that the seed layer extends beyond a sidewall of the conductive pillar, wherein a footing portion of the seed layer laterally protrudes from the sidewall of the conductive pillar;
forming an encapsulant aside the die to encapsulate sidewalls of the die, wherein a top surface and a sidewall of the footing portion is covered by the encapsulant;
forming a redistribution (RDL) structure on the die and the encapsulant, the RDL structure is electrically connected to the die; and
forming a conductive terminal, electrically connected to the die through the RDL structure.

16. The method of claim 15, wherein during the etching process, an etching selectivity ratio of the test pad to the conductive pillar is less than an etching selectivity ratio of the test pad to the seed layer.

17. The method of claim 15, wherein an etchant used in the etching process comprises an $H_2SO_4$ based etchant, an $HNO_3$ based etchant, or a combination thereof.

18. The method of claim 15, wherein the conducive pillar is consumed from a sidewall during the etching process.

19. The method of claim 15, wherein
before performing the etching process, a first width of the seed layer is less than a first width of the conductive pillar; and
after performing the etching process, a second width of the seed layer is larger than a second width of the conductive pillar.

20. The method of claim 15, wherein the connector is formed to be further electrically connected to another pad of the die adjacent to the pad.

* * * * *